July 2, 1974 F. KOT 3,822,152

GRADUATED SIGE ALLOY THERMOCOUPLE

Original Filed March 30, 1971

INVENTOR.
Francis Kot

By: [signature]
attorney

United States Patent Office 3,822,152
Patented July 2, 1974

3,822,152
GRADUATED SiGe ALLOY THERMOCOUPLE

Francis Kot, Harrison, N.J., assignor to the United States of America as represented by the United States Atomic Energy Commission Continuation of abandoned application Ser. No. 101,539, Mar. 30, 1971. This application Apr. 25, 1973, Ser. No. 354,415
Int. Cl. H01v *1/08*
U.S. Cl. 136—237 2 Claims

ABSTRACT OF THE DISCLOSURE

Method and apparatus providing a mechanically sound, low electrical and thermal resistance, metal contact for cold junctions for high silicon content silicon-germanium alloys for use in thermocouples for thermoelectric power generation.

CROSS REFERENCE TO RELATED APPLICATIONS

This is a continuation of application Ser. No. 101,539, filed Mar. 30, 1971 now abandoned.

Co-pending U.S. Application S.N. 841,958, filed July 15, 1969; by Arthur J. Seuffert on "Method for Producing a Chromium-Tungsten Coating on Tungsten for Protection Against Oxidation at Elevated Temperatures," assigned to the assignee of this application.

Co-pending U.S. Application S.N. 697,281, filed Jan. 5, 1968; by James E. Monroe on "Technique for Applying Thermal Shock Resistant and Obtaining Variable Emissivity Coatings for Metal Structures," assigned to the assignee of this application.

BACKGROUND OF THE INVENTION

This invention was made in the course of, or under a contract with the United States Atomic Energy Commission.

In the field of nuclear auxiliary power and/or the field referred to hereinafter by the acronym SNAP, it has often been advantageous to provide a tungsten cold shoe contact junction between the silicon germanium alloy thermoelectric portion of the cold stack and the remainder thereof, such as described and shown in the above-mentioned co-pending application by Seuffert, as well as U.S. Pat. 3,342,567, and/or U.S. Pat. 3,235,957. As described in the above-mentioned co-pending application, the silicon germanium alloy has comprised 63.5 At. percent silicon in one attempt to match the thermal expansions of the silicon germanium portion of the cold stack and the tungsten cold shoe contact. However, the success of this attempt has been mixed or unsatisfactory. For example, cracking of the SiGe-W contact junction has been a problem. Likewise, it has been difficult heretofore uniformly and consistently to obtain high electrical and/or thermal contact resistance. It has additionally been advantageous to provide high Si content SiGe alloy thermoelectric elements and contacts therefor and/or to employ them dependably for use in SNAP applications.

It is an object of this invention, therefore, to provide improved function contacts for SiGe thermoelectric elements;

It is also an object to provide an improved silicon germanium, thermoelectric cold stack;

It is also an object to provide close thermal expansion matches between silicon germanium thermoelectric elements and the cold junctions therefor;

It is an another object to prevent cracking in SiGe-W thermoelectric junctions;

It is a further object to provide high silicon content SiGe alloy thermoelements, and tungsten contacts therefor;

It is a still further object to provide low electrical and thermal thermoelectric junction resistances.

SUMMARY OF THE INVENTION

This invention provides a specific thermoelectric device having a specific SiGe element, and a specific transition piece sandwiched between the mentioned SiGe element and a tungsten cold junction contact thereof. As such, this invention is an improvement on the inventions described, in the above-cited applications, wherein there is provided an improved thermoelectric device having a superior tungsten-silicon germanium junction. More particularly, this invention provides a high silicon content SiGe alloy thermoelectric element and a specific silicon-germanium transition piece between the SiGe thermoelectric element and a tungsten cold shoe junction. In one embodiment, the SiGe alloy thermoelectric element has therein at least 70 At. percent Si, and the transition piece is a 63.5 At. percent silicon-germanium alloy between the cold shoe and the high silicon content SiGe alloy. This has the advantage of combining thermoelectric advantages of the high silicon content SiGe alloy thermoelectric element, with the proven superiority of the tungsten cold shoe contact. With the proper selection and assembly of the elements the desired mechanically sound, low electrical and thermal resistance thermoelectric device and cold junction contact therefor are achieved in accordance with invention, as described in more detail hereinafter.

BRIEF DESCRIPTION OF THE DRAWINGS

The single figure is a partial side view of one typical cold stack of thermoelectric elements for use with this invention.

DESCRIPTION OF THE PREFERRED EMBODIMENT

Figure 1:
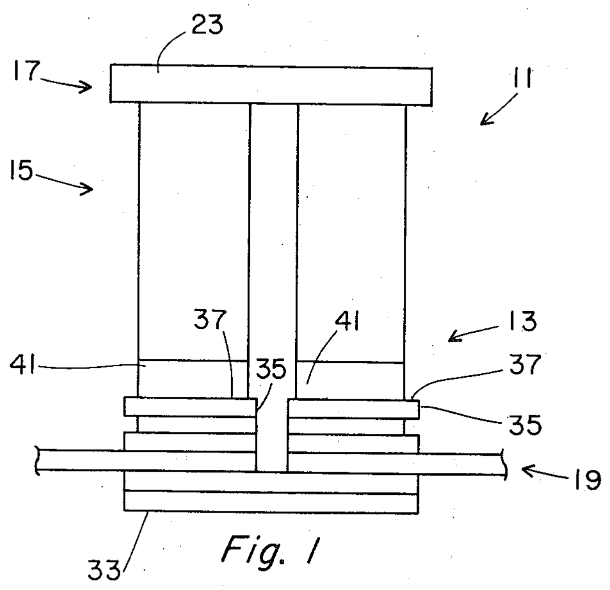

This invention is useful in forming cold junctions for silicon-germanium thermoelectric devices and more particularly to such devices that operate at over 600° C., in vac. for terrestrial applications, and in a vacuum for space applications. However, the method and apparatus of this invention are useful in any of the applications to which the subject matter of the above-mentioned copending applications are useful, as will be understood by one skilled in the art from the following.

Referring now to the single figure, thermoelectric device 11 forms a stack 13 of elements comprising a SiGe alloy thermoelectric element 15 having 70 to 85 At. percent Si for operation in a terrestrial primary launch ambient and a low pressure space ambient for the production of electrical power due to a thermal gradient across the element 15 from a hot junction end 17 to a cold junction end 19 thereof. Advantageously, to this end of a plurality of these thermoelectric devices 11 are assembled in a cascade such as disclosed by the above-mentioned co-pending applications to form a converter having a heat source, such as the radiosotope heat source contemplated by said application, as will be understood therefrom and from U.S. Pat. 3,192,069 or U.S. Pat. 3,520,734 but which is not shown herein for ease of explanation. It will be understood that in one embodiment, the SiGe element 15 of the device 11 shown in the single figure, advantageously comprises 80 atomic percent silicon, and a remainder comprising about 20 atomic percent germanium having small amounts of other materials therein, such as conventional n or p type dopants that since they are well known in the art, are not discussed herein in more detail. Advantageously, the SiGe element 15 is hot-pressed and zoned leveled by conventional means well known in the art, as discussed e.g. in reports ALO(2510)-1 through 10 under RCA contract AT(29-2)-2510 with the U.S.A.E.C. In this regard, these thermoelectric elements are adapted to be operated at hot junction temperatures of up to 1100° C. or more and cold junction temperatures in the vicinity of 500° C.

In one embodiment, the parameters of elements 14 of one device 11, are provided in the following and Table I:

TABLE I

| | |
|---|---|
| Insulation | Metallic Foil & molybdenum and/or zirconia cloth. |
| Thermoelectric Device **11** | |
| Hot shoe **23** | 1.0" x 1.0" x 0.75", Hot-pressed SiMo. |
| Element | 2.03 cm. (0.8") long. |
| n-Type Element | 0.1935 cm.$^2$ (0.03 in.$^2$) area. |
| p-Type Element | 0.1935 cm.$^2$( 0.03 in.$^2$) area, Hot - pressed 80% SiGe. |
| Leg diameter | .275". |
| No. of Devices **11** | 18. |
| Spacing between Hot Shoes **23** | 0.070". |
| Cold Stack | Gold components. |
| Radiator **33** | Beryllium having Inconel 750X stud attachment. |

Tungsten body 35 has a desired disc-shaped form and size, and opposing major faces formed with a diameter of about 0.5 inch and a thickness of about .02 to .04 inch. One such W body is described in U.S. Pat. 3,342,567.

Heretofore, the bonding of such tungsten bodies 35 to SiGe thermoelectric elements 15, and as those described above, has been difficult or has resulted in defects such as cracks and the like. Also, the junctions 37 between the heretofore known W-SiGe elements 14 have often had undesirably high thermal and/or electrical resistances. However, should a specific At. percent Si containing SiGe cold shoe disc 41 be sandwiched in between W body 35 and 80 At. percent Si containing SiGe element 15 so as to contact therewith in accordance with this invention, those heretofore known problems can be avoided.

The above-described specific cold shoe disc 41 has the advantage of a close thermal expansion match with the above-described W body 35. This prevents cracking in the SiGe-W junctions 37 and provides a desired low electrical and thermal resistance across junctions 37. Additionally, the described specific combination has the advantage of improved efficiency and long-term stability at elevated temperatures. In this regard, the described element 15, which comprises 80 At. percent Si, is superior in the mentioned particulars to elements 15 having higher or lower percentages of Si.

Also attempts to bond tungsten bodies 35 directly to the described elements 15, have heretofore resulted in a high incidence of unsatisfactory bonds due to the mismatch of the thermal expansion coefficients of these described elements. However, the use of the described specific cold shoe disc 41 between the described W body 35 and the specific high Si element 15 in accordance with this invention, avoids this heretofore known bonding problem.

The method and apparatus of the described invention combine the thermoelectric advantages of the described high silicon content SiGe alloy with the superiority of the described tungsten cold shoe 35, and form an improved thermoelectric device 11 for use in a wide variety of SNAP applications. One such application that this invention is particularly well suited for is the described high temperature space application having radio-isotope heat source.

What is claimed is:

1. In a SiGe thermoelectric device having a tungsten body, a hot shoe end, and SiGe thermoelectric means between said tungsten body and said hot shoe end, the improvement consisting of:

a. an 80 At. percent Si content SiGe alloy thermoelectric first element next to said hot shoe end; and b. a 63.5 At. percent Si content SiGe disc-shaped transition element sandwiched between the 80 At. percent Si content SiGe alloy thermoelectric first element and said tungsten body, which is disc-shaped, so as to provide a graduated SiGe thermoelectric device in a stack.

2. The device of claim 1 in which said graduated SiGe thermoelectric means in a stack consists of:

a. said hot shoe end;

b. a hot-pressed and zone leveled, longitudinally extending, 80 At. percent Silicon content, SiGe alloy, thermoelectrical first element at said hot shoe end; and c. a 63.5 At. percent silicon content transition piece forming a cold shoe disc in content with the first element at one end and said tungsten body at the other end thereof.

References Cited

UNITED STATES PATENTS

| | | | |
|---|---|---|---|
| 3,432,365 | 3/1969 | Katz et al. | 136—237 |
| 3,496,027 | 2/1970 | Dingwall et al. | 136—239 X |
| 3,442,718 | 5/1969 | Dingwall et al. | 136—239 X |
| 3,728,160 | 4/1973 | DesChamps et al. | 136—202 |
| 3,050,574 | 8/1962 | Rosi | 29—573 UX |
| 3,342,567 | 9/1967 | Dingwall | 136—239 X |
| 3,452,423 | 7/1969 | Webb | 136—205 |
| 3,666,566 | 5/1972 | Paine | 136—202 |

OTHER REFERENCES

U.S.A.E.C., "High-Temperature Radiosotope Thermoelectric Generator for Space Applications," Report TID-22350, available to public Nov. 15, 1965, pp. 63–73.

E. A. MILLER, Assistant Examiner

U.S. Cl. X.R.

136—202, 239